United States Patent
Liu et al.

(10) Patent No.: US 9,202,919 B1
(45) Date of Patent: Dec. 1, 2015

(54) FINFETS AND TECHNIQUES FOR CONTROLLING SOURCE AND DRAIN JUNCTION PROFILES IN FINFETS

(71) Applicants: STMicroelectronics, Inc., Coppell, TX (US); International Business Machines Corporation, Armonk, NY (US); GLOBALFOUNDRIES Inc., Grand Cayman (KY)

(72) Inventors: Qing Liu, Watervliet, NY (US); Ruilong Xie, Schenectady, NY (US); Xiuyu Cai, Niskayuna, NY (US); Kejia Wang, Poughkeepsie, NY (US); Chun-chen Yeh, Clifton Park, NY (US)

(73) Assignees: STMicroelectronics, Inc., Coppell, TX (US); International Business Machines Corporation, Armonk, NY (US); GlobalFoundries Inc., Grand Cayman (KY)

( * ) Notice: Subject to any disclaimer, the term of this patent is extended or adjusted under 35 U.S.C. 154(b) by 0 days.

(21) Appl. No.: 14/447,685

(22) Filed: Jul. 31, 2014

(51) Int. Cl.
*H01L 29/66* (2006.01)
*H01L 29/78* (2006.01)

(52) U.S. Cl.
CPC .......... *H01L 29/785* (2013.01); *H01L 29/6656* (2013.01); *H01L 29/66795* (2013.01)

(58) Field of Classification Search
CPC ............ H01L 29/66795; H01L 29/785; H01L 21/845; H01L 21/823431; H01L 21/823821; H01L 29/66545; H01L 27/1211; H01L 29/66621; H01L 29/7854; H01L 29/7848; H01L 29/7851; H01L 21/76224; H01L 27/0924
See application file for complete search history.

(56) References Cited

U.S. PATENT DOCUMENTS

| | | | |
|---|---|---|---|
| 2012/0153387 A1* | 6/2012 | Murthy et al. | 257/335 |
| 2013/0052778 A1* | 2/2013 | Liao et al. | 438/197 |
| 2013/0248948 A1* | 9/2013 | Ma et al. | 257/288 |

* cited by examiner

*Primary Examiner* — Roy Potter
*Assistant Examiner* — Paul Patton
(74) *Attorney, Agent, or Firm* — Gardere Wynne Sewell LLP

(57) ABSTRACT

Techniques and structures for shaping the source and drain junction profiles of a finFET are described. A fin may be partially recessed at the source and drain regions of the fin-FET. The partially recessed fin may be further recessed laterally and vertically, such that the laterally recessed portion extends under at least a portion of the finFET's gate structure. Source and drain regions of the finFET may be formed by growing a buffer layer on the etched surfaces of the fin and/or growing a source and drain layer at the source and drain regions of the fin. The lateral recess can improve channel-length uniformity along the height of the fin.

26 Claims, 11 Drawing Sheets

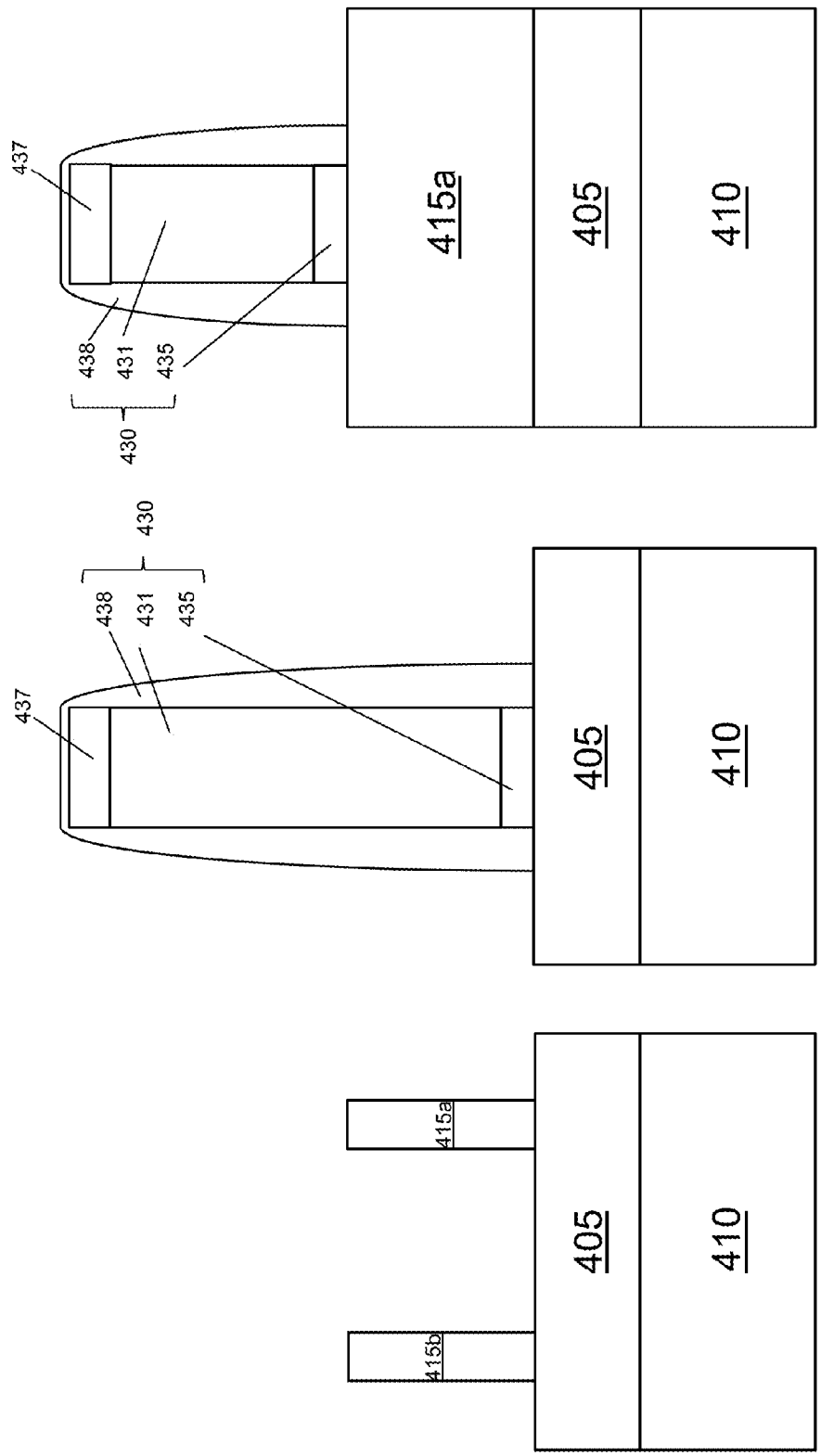

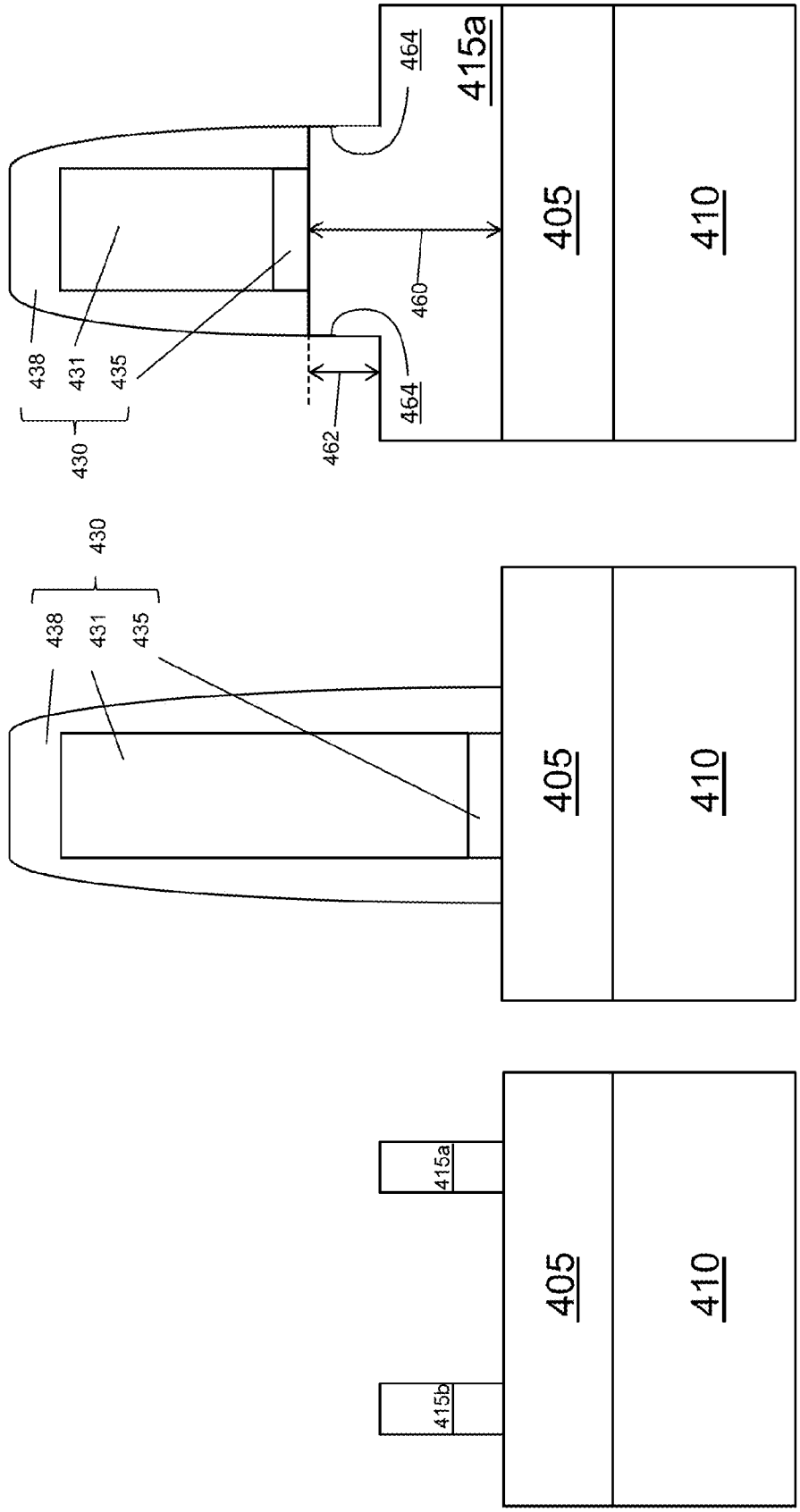

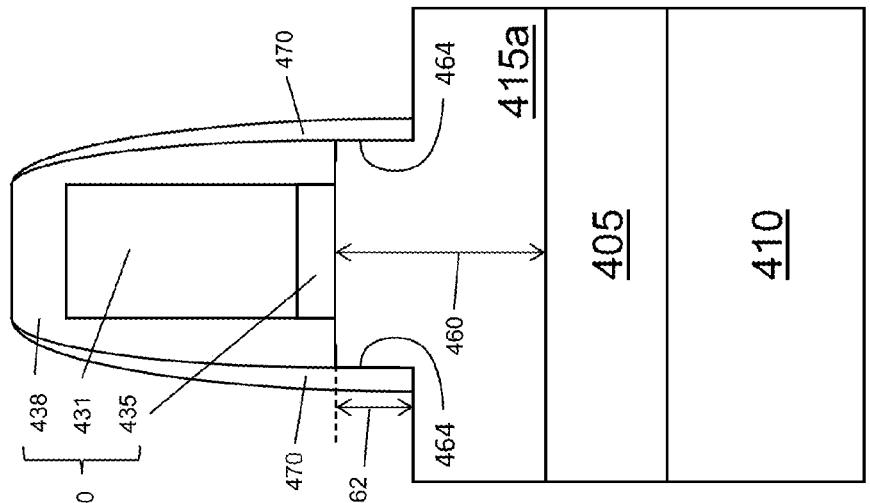
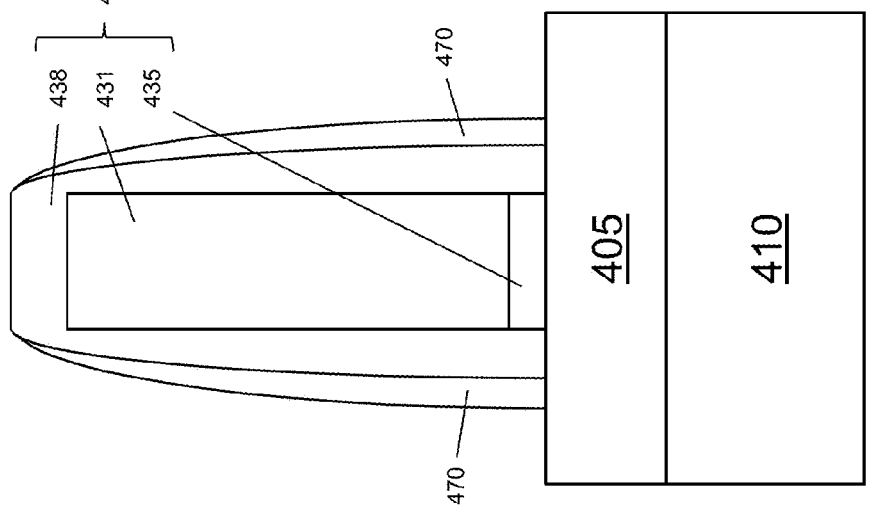
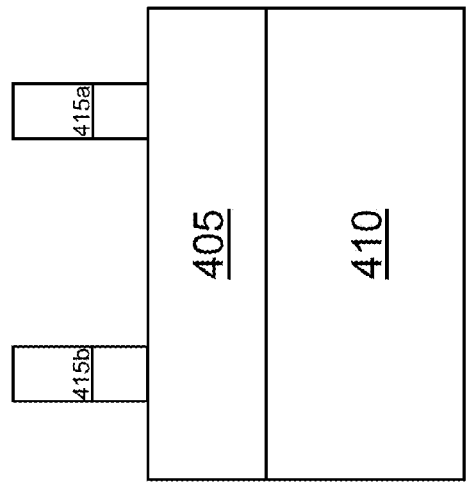
FIG. 8C
FIG. 8B
FIG. 8A

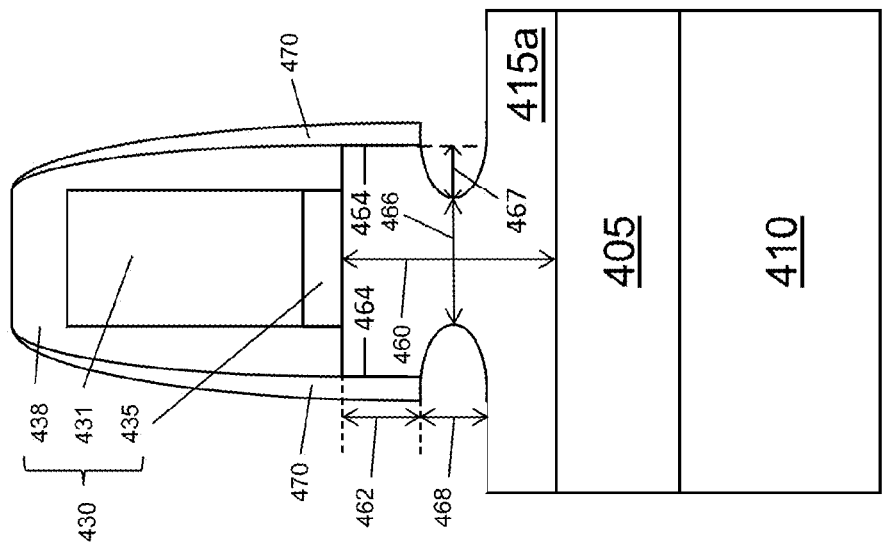
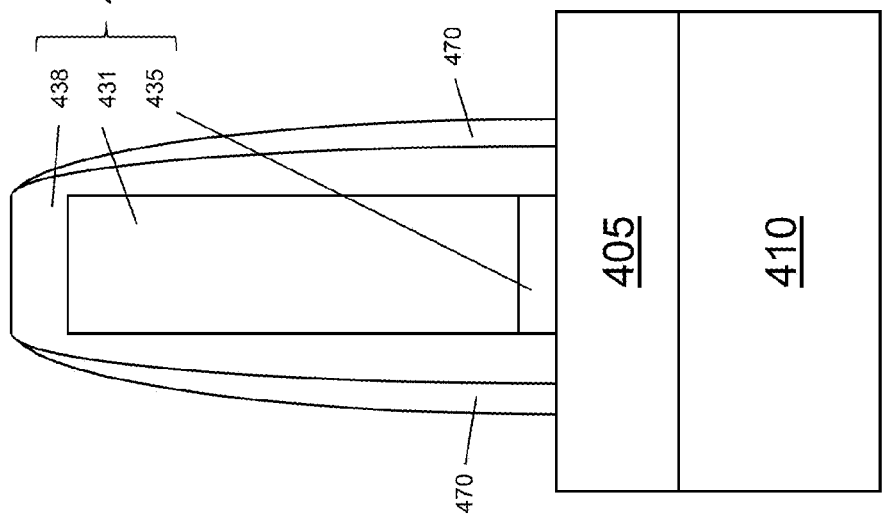
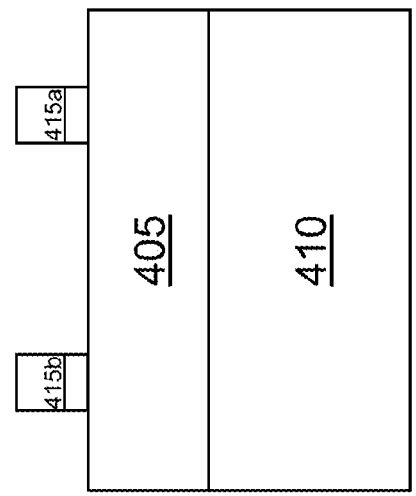
FIG. 9C
FIG. 9B
FIG. 9A

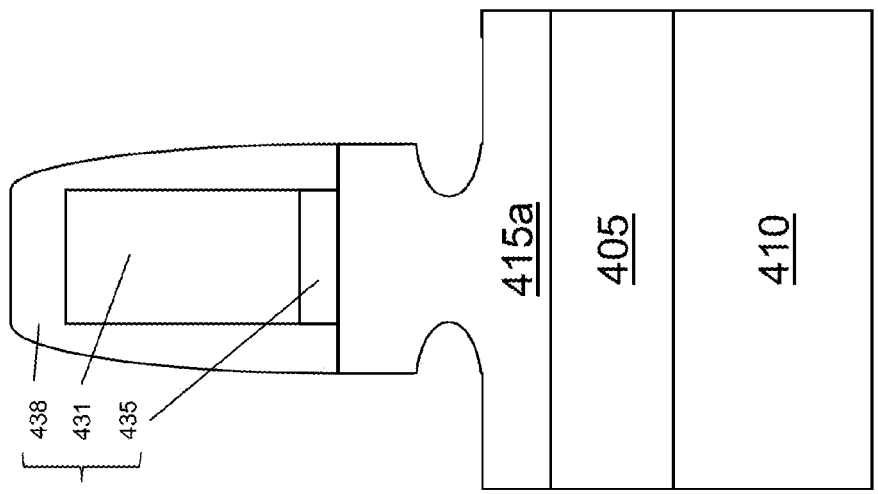
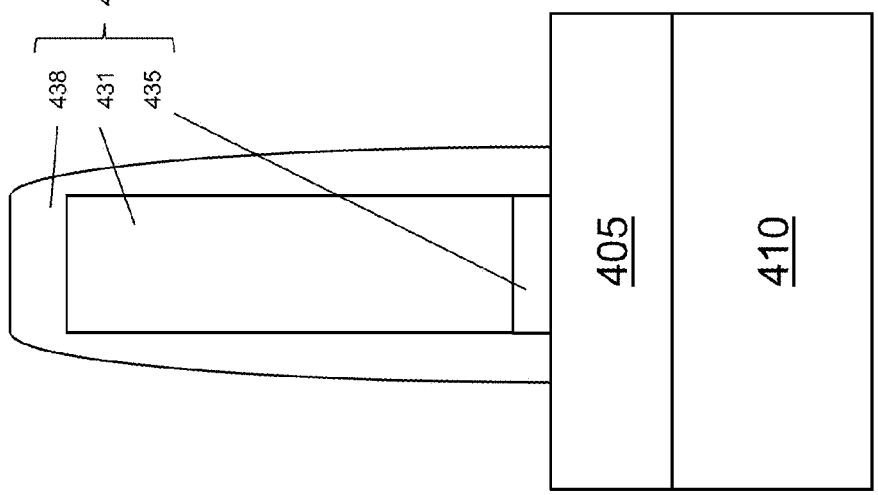
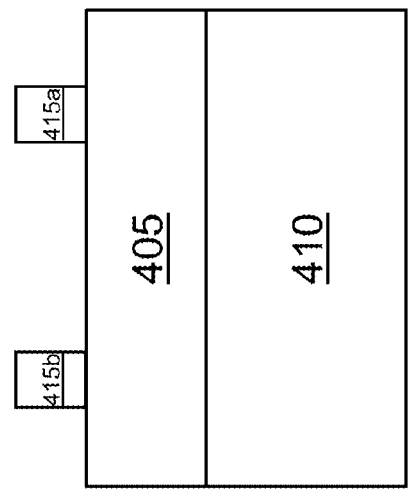
FIG. 10C
FIG. 10B
FIG. 10A

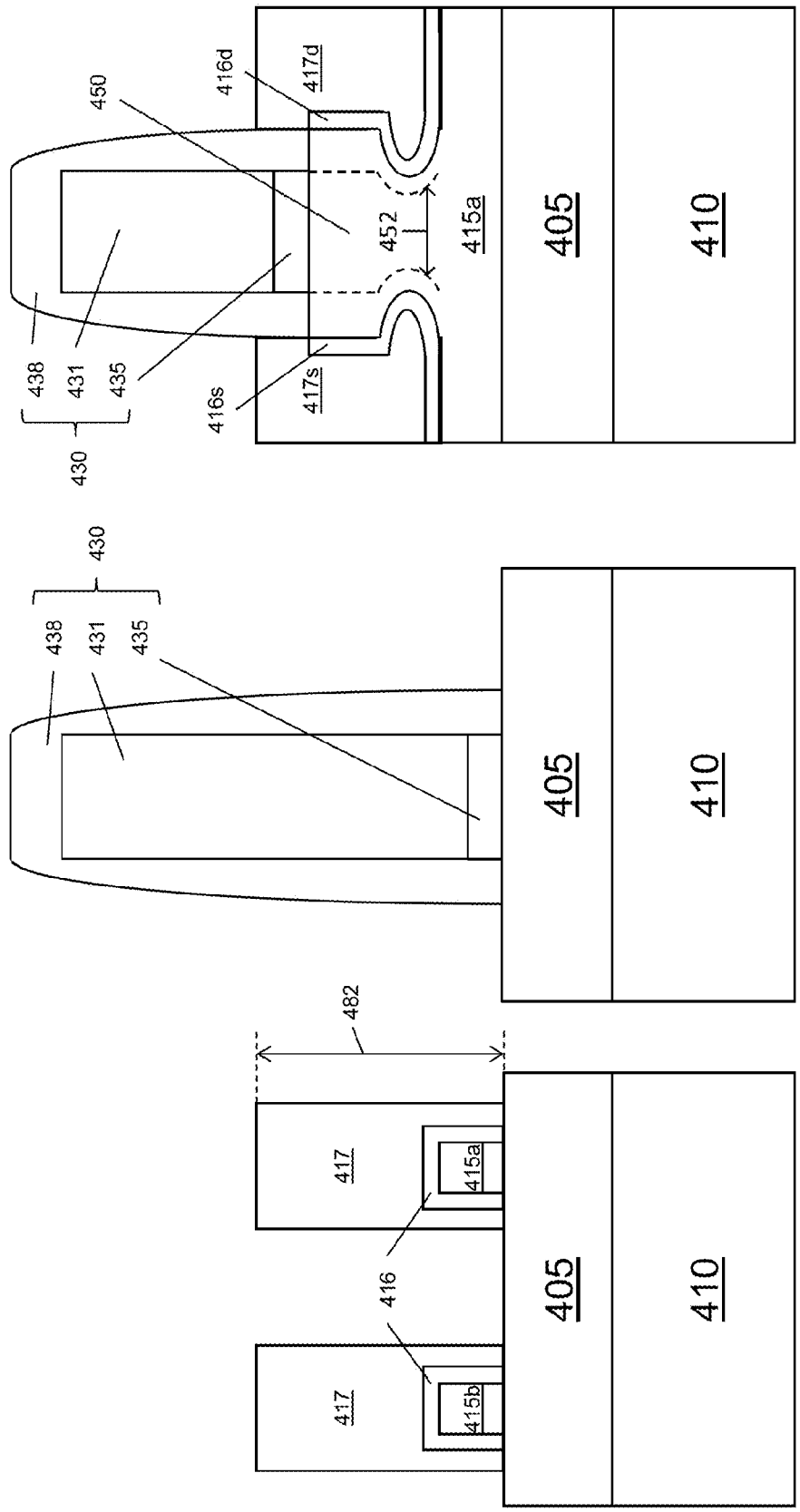

FINFETS AND TECHNIQUES FOR CONTROLLING SOURCE AND DRAIN JUNCTION PROFILES IN FINFETS

BACKGROUND

1. Technical Field

The present disclosure relates to methods of forming semiconductor devices having one or more fin structures ("fins"), and to semiconductor devices having one or more fins. Some embodiments described in the present disclosure relate to techniques for controlling channel profile in finFETs, and/or to finFETs having a specified channel profile.

2. Discussion of the Related Art

Transistors are fundamental device elements of many modern digital processors and memory devices, and have found numerous applications in various areas of electronics including data processing, data storage, and high-power applications. Currently, there are a variety of transistor types and designs that may be used for different applications. Various transistor types include, for example, bipolar junction transistors (BJT), junction field-effect transistors (JFET), metal-oxide-semiconductor field-effect transistors (MOSFET), vertical channel or trench field-effect transistors, and superjunction or multi-drain transistors.

Two types of transistors which have emerged within the MOSFET family of transistors show promise for scaling to ultra-high density and nanometer-scale channel lengths. One of these transistor types is a so-called fin field-effect transistor or "finFET." The channel of a finFET is formed in a three-dimensional fin that may extend from a surface of a substrate. FinFETs have favorable electrostatic properties for complimentary MOS (CMOS) scaling to smaller sizes. Because the fin is a three-dimensional structure, the transistor's channel can be formed on three or more surfaces of the fin, so that the finFET can exhibit a high current switching capability for a given surface area occupied on substrate. Since the channel and device can be raised from the substrate surface, there can be reduced electric field coupling between adjacent devices as compared to conventional planer MOSFETs.

The second type of transistor is called a fully-depleted, silicon-on-insulator or "FD-SOI" FET. The channel, source, and drain of an FD-SOI FET are formed in a thin planar semiconductor layer that overlies a thin insulator. Because the semiconductor layer and the underlying insulator are thin, the body of the transistor (which lies below the thin insulator) can act as a second gate. The thin layer of semiconductor on insulator permits higher body biasing voltages that can boost performance. The thin insulator also reduces leakage current to the transistor's body region relative to the leakage current that would otherwise occur in bulk FET devices.

SUMMARY

Structures and methods for finFETs having shaped source and drain junction profiles are described. According to some embodiments, a combination of anisotropic and isotropic etching may be used to vertically and laterally etch portions of a fin adjacent a channel region to obtain an under-etch profile. Because of the under-etch profile, source and drain junctions may provide approximately uniform channel lengths throughout at least a portion of the fin height. In some embodiments, the channel lengths may be shorter near a base of the fin (toward the substrate) than near a top of the fin (farther from the substrate).

According to some embodiments, a finFET may comprise a fin formed on a substrate, a gate structure enclosing a channel region of the fin, a source region formed adjacent to the channel region, and a drain region formed adjacent to the channel region. A first distance between source and drain junctions in the fin at a first location nearer to the substrate may be less than a second distance between source and drain junctions in the fin at a second location farther from the substrate. In some aspects, the fin may be formed of a first semiconductor material, and the source and drain regions are formed of a second semiconductor material.

According to some implementations, the finFET may further comprise a buffer layer located between the first semiconductor material of the fin and the second semiconductor material of the source and drain regions. A dopant density of the buffer layer may be higher than a dopant density in the channel region and lower than a dopant density of the source and drain regions. In some aspects, a dopant density of the buffer layer is between approximately $3 \times 10^{20}$ cm$^{-3}$ and approximately $1 \times 10^{21}$ cm$^{-3}$. In some implementations, the buffer layer is formed of the second semiconductor material. In some aspects, the gate structure includes a spacer layer, and at least a first portion of the buffer layer extends laterally beyond at least a portion of the spacer layer in a direction of the channel region.

According to some implementations, the second semiconductor material comprises epitaxially-formed semiconductor material having a lattice constant different than the first semiconductor material.

In some aspects, a first portion of the channel region farther from the substrate than a second portion of the channel region provides a substantially uniform channel length between the source and the drain junctions. In some aspects, a height of the first portion of the channel region is between approximately 6 nm and approximately 20 nm. In some implementations, a height of the second portion of the channel region is at least 6 nm, and an average channel length provided by the second portion of the channel region is less than the channel length provided by the first portion of the channel region. In further aspects, a minimum channel length provided by the second portion of the channel region is at least approximately 18 nm.

According to some implementations, a height of the first portion of the channel region is at least 20% of a total height of the fin between the gate structure and the substrate. In some aspects, a height of the first portion of the channel region is between approximately 20% and approximately 40% of a total height of the fin between the gate structure and the substrate. In some implementations, a height of the second portion of the channel region is between approximately 20% and 40% of a total height of the fin between the gate structure and the substrate, and an average channel length provided by the second portion of the channel region is less than the channel length provided by the first portion of the channel region. According to some aspects, the second portion of the channel region has been recessed laterally inward under the first portion of the channel region at the source and drain junctions.

The foregoing aspects and implementations associated with a finFET having shaped source and drain junction profiles may be included in any suitable combination in one or more embodiments of a finFET structure.

In some embodiments, a method for shaping source and drain junction profiles of a finFET may comprise acts of anisotropically etching first portions of a fin to partially recess source and drain regions adjacent to a channel region of the fin, wherein the channel region of the fin is under a gate structure of the finFET, and isotropically etching the partially recessed source and drain regions to at least laterally recess a base portion of the fin under at least a portion of the gate structure. The gate structure may include at least one spacer layer formed on a gate conductor.

In some aspects, the act of isotropically etching does not etch a portion of the fin above the base portion. An embodiment of a method may include an aspect of forming a sacrificial layer that covers endwalls of the portion of the fin above the base portion at the partially recessed source and drain regions, wherein the sacrificial layer protects the portion of the fin above the base portion from the isotropic etching. In some implementations, the act of isotropically etching laterally recesses the base portion of the fin between approximately 5 nm and approximately 15 nm.

Some embodiments of a method may include an aspect of forming a buffer layer that is between 2 nm and 6 nm thick at least at endwalls of the fin adjacent the channel region, wherein a dopant density of the buffer layer is between approximately $3 \times 10^{20}$ cm$^{-3}$ and approximately $1 \times 10^{21}$ cm$^{-3}$.

Some embodiments may include forming a source and drain layer at the recessed source and drain regions, wherein the source and drain layer is formed of a semiconductor material having a different lattice constant than the semiconductor material of the fin. In some aspects, the source and drain layer are formed of SiC or SiGe and the fin is formed of Si. Some embodiments may include an aspect of forming the buffer layer and the source and drain layer from a same material.

In some embodiments, a method for shaping source and drain junction profiles of a finFET may comprise etching a fin to partially recess portions of the fin corresponding to source and drain regions of the finFET, wherein the recessed portions of the fin are adjacent to a first portion of the fin and the first portion of the fin is under a gate structure of the finFET. In some implementations, the gate structure may include at least one spacer layer formed on a gate conductor. The method may further comprise forming a sacrificial layer adjacent to the first portion of the fin to protect the first portion of the fin from etching, and etching the fin to laterally recess a second portion of the fin under at least a part of the first portion of the fin.

In some aspects, the act of etching a fin to partially recess portions of the fin comprises anisotropic etching and the act of etching the fin to laterally recess a second portion of the fin comprises isotropic etching. In some implementations, the act of etching the fin to laterally recess a second portion of the fin recesses the second portion of the fin between approximately 5 nm and approximately 15 nm in a direction under the gate structure.

The foregoing aspects and implementations relating to acts for shaping source and drain junctions for a finFET may be used in any suitable combination in one or more embodiments of methods for making finFETs. Additionally, any of the above-described method embodiments may be used to fabricate any of the finFET structure embodiments described above.

The foregoing and other aspects, embodiments, and features of the present teachings can be more fully understood from the following description in conjunction with the accompanying drawings.

BRIEF DESCRIPTION OF THE DRAWINGS

One of ordinary skill in the art will understand that the figures, described herein, are for illustration purposes only. In some instances various aspects of the illustrated embodiments may be shown exaggerated or enlarged to facilitate an understanding of the embodiments. In the drawings, like reference characters generally refer to like features, functionally similar elements and/or structurally similar elements throughout the various figures. The drawings are not necessarily to scale, emphasis instead being placed upon illustrating the principles of the teachings. Where the drawings relate to fabrication of integrated devices, an illustrated device may be representative of a large plurality of devices that may be fabricated in parallel. The drawings are not intended to limit the scope of the present teachings in any way.

FIGS. 6A, 6B, and 6C show cross-sectional views of finFET 402 along A-A', B-B', and C-C', respectively, at the same stage of the fabrication process as illustrated in FIG. 5, according to some embodiments;

FIGS. 7A, 7B, and 7C show cross-sectional views of finFET 402 along A-A', B-B', and C-C', respectively, after another portion of a fabrication process, according to some embodiments;

FIGS. 8A, 8B, and 8C show cross-sectional views of finFET 402 along A-A', B-B', and C-C', respectively, after another portion of a fabrication process, according to some embodiments;

FIGS. 9A, 9B, and 9C show cross-sectional views of finFET 402 along A-A', B-B', and C-C', respectively, after another portion of a fabrication process, according to some embodiments;

FIGS. 10A, 10B, and 10C show cross-sectional views of finFET 402 along A-A', B-B', and C-C', respectively, after another portion of a fabrication process, according to some embodiments;

FIGS. 12A, 12B, and 12C show cross-sectional views of finFET 402 along A-A', B-B', and C-C', respectively, after another portion of a fabrication process, according to some embodiments.

DETAILED DESCRIPTION

Figure 1:
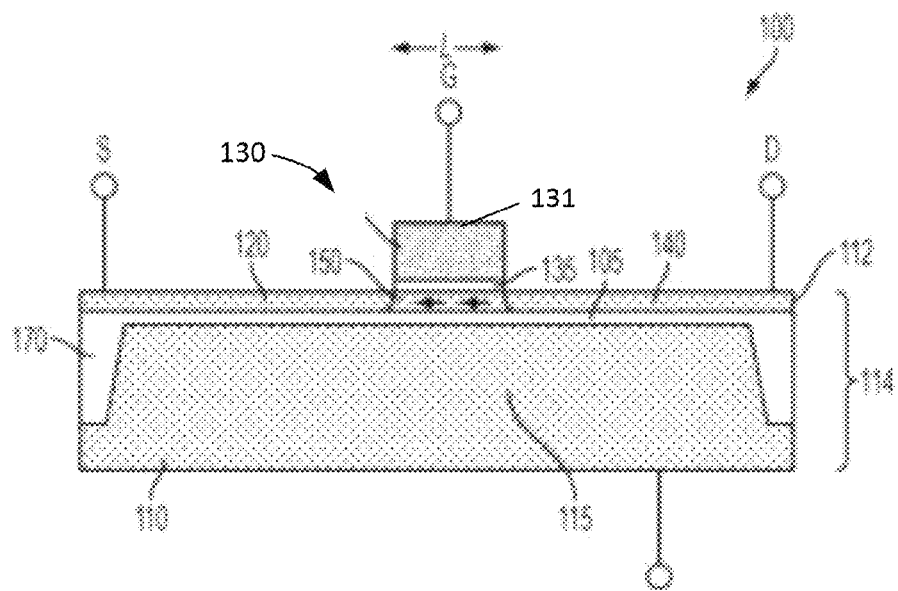
FIG. 1 shows an elevation view of an FD-SOI FET.

An example of a fully-depleted silicon-on-insulator (FD-SOI) FET 100 is depicted in FIG. 1, according to some embodiments. The FD-SOI FET may comprise a source region 120, a gate structure 130, a drain region 140, and a channel region 150. The source, channel, and drain regions may be formed in a thin semiconductor layer 112 that is formed adjacent an insulating layer 105 (e.g., a thin insulating layer or buried oxide layer). The insulating layer 105 may be formed adjacent a substrate layer 110. In some embodiments, the substrate layer 110, insulating layer 105, and thin semiconductor layer 112 may collectively form a silicon-on-insulator (SOI) substrate 114. In some implementations, the semiconductor layer 112 and insulating layer 105 are ultrathin, e.g., less than about 35 nm or less than about 20 nm. Such devices may be referred to as ultra-thin body and buried oxide (UTBB) devices. In a UTBB structure, the insulating layer 105 may be less than about 30 nm in thickness, with a thickness of about 25 nm for some embodiments, and the semiconductor layer 112 may be less than about 10 nm in thickness, with a thickness of about 7 nm for some embodiments, for example. In some embodiments, trench isolation structures 170 comprising electrically-insulating material may be formed around one or more FD-SOI FETs. The gate structure 130 may comprise a gate conductor 131 and a thin gate insulator 135. According to some embodiments, integrated source S, gate G, drain D, and body B interconnects may be formed to provide electrical connections to the source, gate, drain, and back body regions of the FD-SOI FET.

In some embodiments, the source region 120 and drain region 140 of an FD-SOI FET may be doped with acceptor or donor impurities to form regions of a first conductivity type (e.g., p-type or n-type). The channel region 150 may be doped to be of an opposite conductivity type, and may be of a same conductivity type as a back body region 115 (e.g., partially-depleted SOI or PD-SOI). In some implementations, the channel region 150 may be undoped (FD-SOI). An FD-SOI FET can exhibit reduced leakage currents compared to bulk FET devices and offer flexible bias strategies for improving speed or reducing threshold voltages for low-voltage applications.

Figure 2:
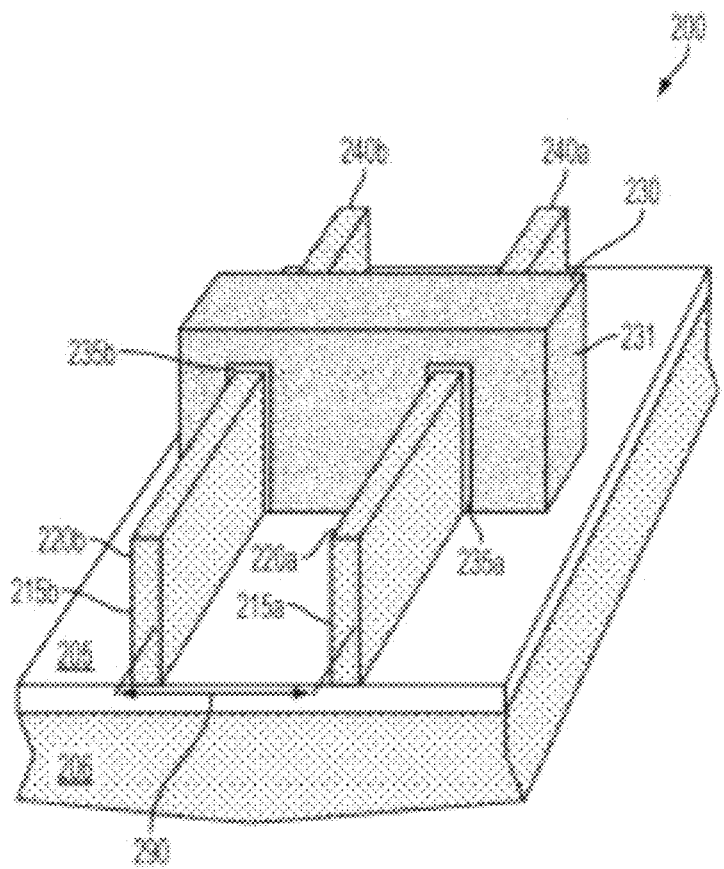
FIG. 2 shows a perspective view of a finFET, according to some embodiments.

An example of a finFET 200 is depicted in the perspective view of FIG. 2, according to some embodiments. In some embodiments, a finFET may be fabricated on a bulk semiconductor substrate 206, e.g., a bulk silicon substrate, and comprise one or more fin-like structures (215a, 215b) that run in a length direction along a surface of the substrate and extend in a height direction normal to the substrate surface. The fins 215 may have narrow widths, e.g., less than 50 nanometers. There may be an electrically-insulating layer 205, e.g., an oxide layer, on a surface of the substrate 206. The fins 215 may pass through the insulating layer 205, but be attached to the semiconducting substrate 206 at a lower region (e.g., "base") of the fin, in some implementations. A gate structure 230 comprising a conductive gate material 231 (e.g., polysilicon) and a gate insulator (235a, 235b) (e.g., an oxide and/or a high dielectric constant material) may be formed over a region of one or more fins. The finFET may further include one or more source regions (220a, 220b) and drain regions (240a, 240b) adjacent to the gate. A finFET may also include integrated source S, gate G, drain D, and body B interconnects (not shown) to provide electrical connections to the source, gate, drain, and back body regions of the device.

In some embodiments, during operation of the finFET, the entire fin portion encased by the gate structure may be inverted and form a bulk channel rather than a surface channel. In some embodiments, a metallic film may be deposited between a conductive gate material 231 and gate insulator 235 (e.g., to improve gate conductance and/or gate switching speeds).

FinFETs like the finFET depicted in FIG. 2 may exhibit favorable electrostatic properties for scaling to high-density, low-power, integrated circuits. Because the fins and channels are raised from the substrate, cross-coupling between proximal devices may be reduced relative to cross-coupling between conventional FETs. For the device shown in FIG. 2, the fins 215 may be formed from the bulk substrate 206 by an etching process, and therefore may be attached to the substrate 206 at base regions of the fins, in some implementations. The insulator 205 may be formed after the etching of the fins 215. Because the fins 215 are attached to the semiconductor substrate, some leakage current and cross-coupling may occur via the base region of the fin.

Alternatively, in some embodiments finFETs may be formed using an SOI substrate. When a finFET is formed with an SOI substrate, the fins may be formed from the semiconductor layer on the insulating layer (e.g., etched from and/or epitaxially grown from the semiconductor layer). In some cases, the fins may be formed by etching through the insulating layer of the SOI substrate and epitaxially growing fins in trenches, such that the base regions of the fins are attached to the substrate layer of the SOI substrate.

Source, channel, and drain regions of a finFET may be doped with donor or acceptor impurities to create different regions of different conductivity types. Several different configurations of source, channel, and drain regions are possible. According to some embodiments, source region 220 and drain region 240 may be doped to be of a first conductivity type and the channel region 250 may be doped to be of an opposite conductivity type (or may be undoped). In some embodiments, the "source region" and "drain region" may include extension regions of the fins that lie between source and drain contact regions and the channel region of the finFET device.

The finFET may further include a body region that may be of a same conductivity type as the channel region, or undoped (e.g., like the channel region). The doping of source and drain regions in a finFET may be of various geometries. In some embodiments, vertical portions of the fin 215 may be doped to form source 220 and drain 240 regions. Alternatively, according to some embodiments, outer sheath portions of a fin 215 may be doped to form source and drain regions.

As has been consistent since the early days of semiconductor device manufacturing, minimum feature sizes of semiconductor devices continue to shrink with successive generations of devices, or manufacturing "nodes," allowing a corresponding increase in the density of devices on an integrated circuit. This trend has been recognized and represented by the well-known Moore's law relationship. As finFETs reduce in size, the length of the channel decreases, and it becomes more difficult to control the diffusion of dopants at the source and drain regions of the finFET, and therefore more difficult to control the junction profiles between the source and drain regions and the channel region. Doping the fin(s) too lightly may yield a finFET with high on-resistance ($R_{ON}$), slow switching speed, and/or low drive current, because the dopant concentration in the portions of the source and drain regions nearest the channel (e.g., in the extension regions) may be unacceptably low. Doping the fin(s) too heavily may increase short-channel effects (SCE) (e.g., leakage current) to unacceptable levels, because a high concentration of dopants may diffuse into portions of the fin covered by the gate (e.g., the extension regions), yielding an unacceptably short channel length.

Figure 3:
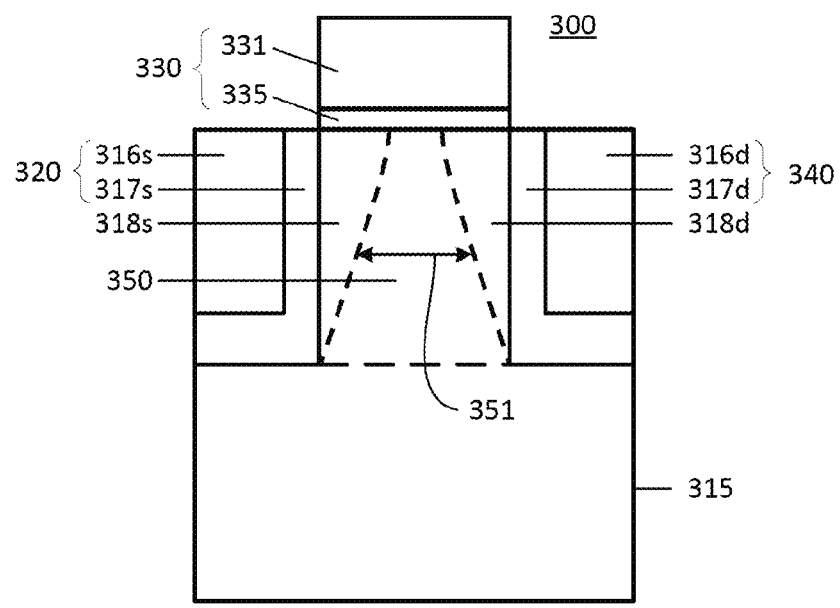
FIG. 3 shows a cross-sectional view of a finFET along the length of a fin, according to some techniques.

Some conventional techniques for fabricating finFETs may yield finFETs with source and drain junction profiles similar to the junction profiles illustrated by the dashed lines in FIG. 3. FIG. 3 shows a cross-sectional view of a finFET 300 along the length of a fin 315, according to some techniques. FinFET 300 includes a fin 315, which includes a source region 320 (including portions 316s and 317s of layers 316 and 317, respectively), a drain region 340 (including portions 316d and 317d of layers 316 and 317, respectively), a channel region 350, and extension regions (318s, 318d) between the channel region and the source/drain regions. A gate structure 330 (with a gate conductor 331 and a gate insulator 335) is formed on the fin 315 and covers the channel region 350.

In the example of FIG. 3, the channel length 351 is relatively short near the top of the channel, and generally increases as the depth of the channel increases. The non-uniform profile of the channel junction may be a result of thermal processing (e.g., dopant drive-in, or annealing of finFET 300), because portions of fin 315 nearer to the top of the channel may become hotter than portions of fin 315 farther from the top of the channel, such that the lateral diffusion of dopants into the portion of fin 315 covered by gate structure 330 may be greater near the top of the channel than near the bottom of the channel. Non-uniform or tapered source and drain junction profiles may increase the variability in performance of different finFETs on the same chip, particularly with respect to the on-resistance and short-channel effects associated with the different finFETs.

The inventors have conceived of techniques and structures for carefully controlling the shape of a finFET's source and drain junction profiles. A finFET's source and drain junction profiles may be shaped such that the channel length is longer at a location nearer to the top of the fin (farther from the substrate), and the channel length is shorter at a location nearer to the bottom of the fin (nearer to the substrate). In some cases, the channel may have a first, substantially uniform length in a first area nearer to the to the top of the fin, and the channel may have a second length, shorter than the first length, in a second area farther from the top of the fin. In some implementations, the length of the channel may be approximately uniform throughout the height of the fin. The source and drain junction profiles may be shaped by etching a fin to partially recess portions of the fin at the source and drain regions and to laterally recess portions of the fin under the gate structure, such that a length of a portion of the fin nearer to the top of the fin is greater than a length of a portion of the fin nearer to the substrate on which the fin is formed. Etching the fin in this manner may enable better control of lateral diffusion of dopants into portions of the fin nearer the substrate, which may yield more uniform source and drain junction profiles than the profile illustrated in FIG. 3. In some embodiments, the source and drain regions may be formed by growing a buffer layer on the etched surfaces of the fin and growing a source and drain layer on the buffer layer, where the buffer layer has a higher concentration of dopants than the channel region, and the source and drain layer has a higher concentration of dopants than the buffer layer. These techniques and structures may address one or more of the above-discussed difficulties associated with shaping the source and drain junction profiles of a finFET.

The various aspects described above, as well as further aspects, will now be described in detail below. It should be appreciated that these aspects may be used alone, all together, or in any combination of two or more, to the extent that they are not mutually exclusive.

Figure 4:
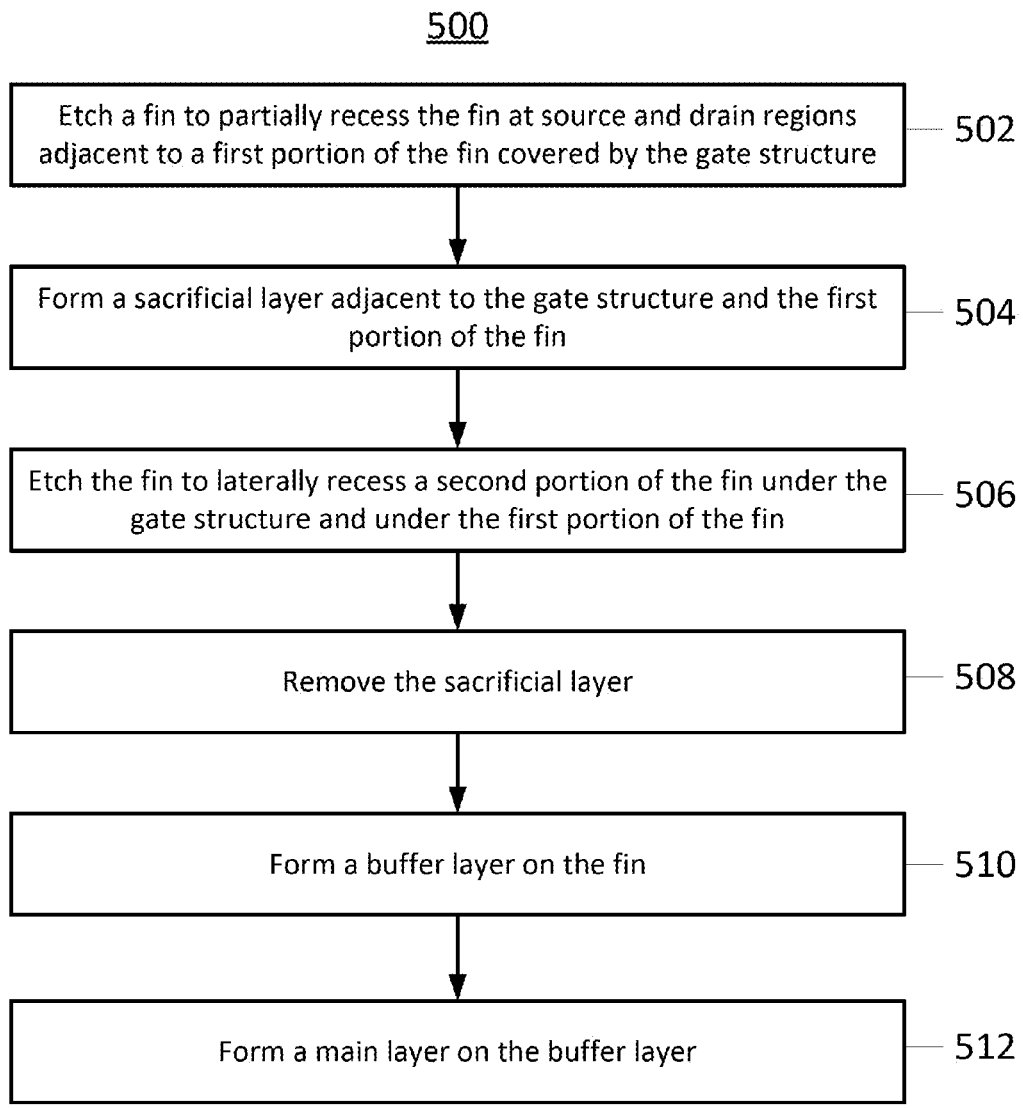
FIG. 4 shows a flowchart of a semiconductor processing method, according to some embodiments.

FIG. 4 shows a flowchart that provides an overview of a semiconductor processing method 500, according to some embodiments. At step 502, a fin of a finFET is etched to partially recess the fin at source and drain regions adjacent to a first portion of the fin covered by a gate structure of the finFET. At step 504, a sacrificial layer may be formed adjacent to the gate structure and the first portion of the fin, to protect the first portion of the fin from etching. At step 506, the fin may be etched to laterally recess a second portion of the fin under part of the gate structure and under part of the first portion of the fin, without etching the first portion of the fin. At step 508, the sacrificial layer may be removed. At step 510, a buffer layer may be formed on the fin, including the surfaces of the fin exposed by the etching to partially recess the fin and to laterally recess the fin. At step 512, a source and drain layer may be formed on the buffer layer. These steps of method 500 are described in further detail below. In some implementations, there may be more or fewer acts than those depicted in FIG. 4. For example, some embodiments of method 500 may consist of steps 502 and 506, or steps 502, 504, and 506. In some embodiments, method 500 may be used during fabrication to shape the source and drain junction profiles of a finFET, such as finFET 402 illustrated in FIG. 5.

Figure 5:
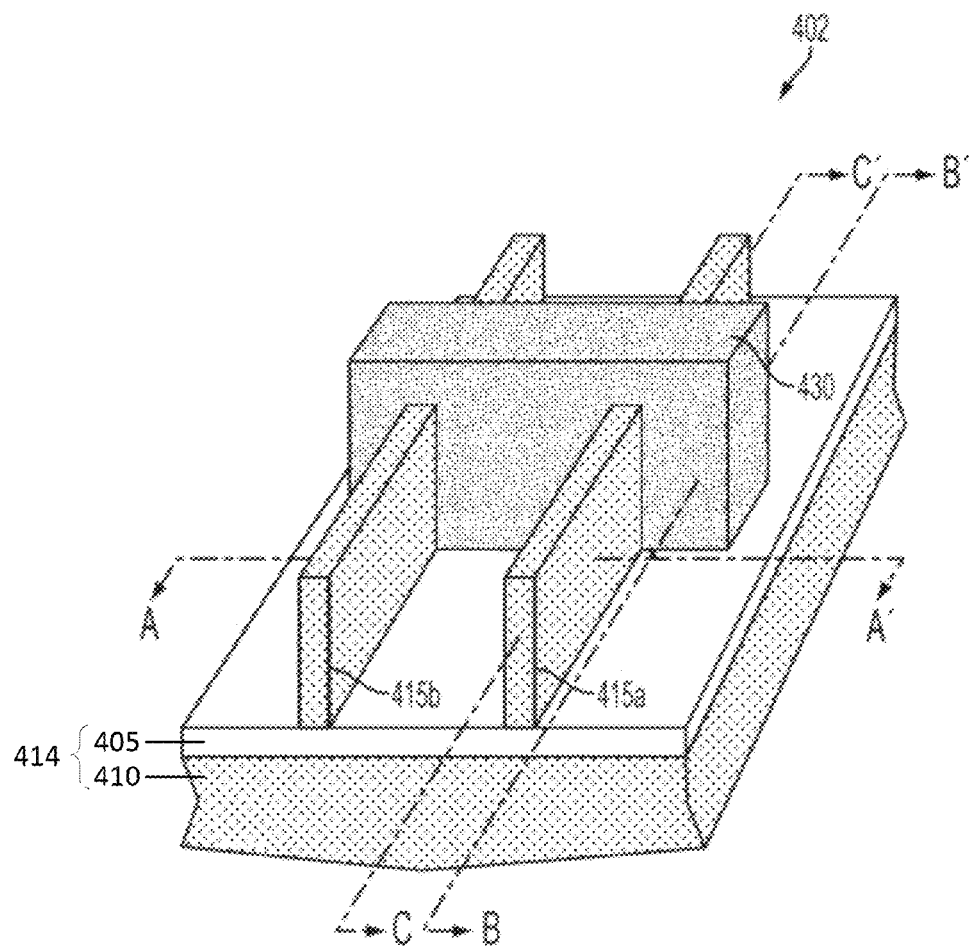
FIG. 5 shows a perspective view of a finFET 402 after a portion of a semiconductor device fabrication process, according to some embodiments.

FIG. 5 shows a cross-sectional view of a finFET 402 at a stage of fabrication prior to performing the acts of semiconductor processing method 500, according to some embodiments. FIGS. 6A, 6B, and 6C show cross-sections of finFET 402 along A-A', B-B', and C-C', respectively, at the same stage of fabrication illustrated in FIG. 5, according to some embodiments. In some embodiments, FinFET 402 may be formed on an SOI substrate 414 having a substrate layer (e.g., silicon substrate layer) 410 and a buried insulating layer 405 (e.g., buried oxide layer), though other semiconductor and insulator materials may be used in other embodiments. Buried insulator 405 may include, but is not limited to, one or more layers of silicon oxide (e.g., $SiO_2$) and/or any other suitable electrically-insulating material. Although FIG. 5 illustrates an SOI substrate 414, the techniques described herein are not limited to devices formed on SOI substrates, and may be applied to devices formed on bulk substrates (e.g., bulk silicon substrates), and/or any other suitable substrates. For bulk substrates, a punch-through stop layer may be formed in the bulk substrate near the base of the fins (e.g., formed by ion implantation), to help prevent punch-through and leakage current flow between source and drain regions.

FinFET 402 may include one or more fins 415. The fin(s) may be formed on the substrate by any suitable process (e.g., using sidewall image transfer (SIT) techniques, a mandrel process, lithographically patterning a resist and etching portions of the substrate to form the fin(s), or by patterning and etching trenches and forming semiconductor material in the trenches to form the fins). In some implementations, lithographic patterning may be done using extreme ultraviolet (EUV) lithography. In some embodiments, the fins (415a, 415b) may have widths (in the direction of cross-sectional line A-A') between approximately 3 nm and approximately 15 nm, and between approximately 3 nm and approximately 10 nm in some embodiments. In some embodiments, the fins may have heights (in the direction normal to the surface of the substrate) between approximately 20 nm and approximately 100 nm. In some implementations, the heights of fins may be between approximately 20 nm and approximately 50 nm. Although FIGS. 6A-6C illustrate an embodiment in which the fins are formed on insulating layer 405, in some embodiments the fins 415 may pass through the insulating layer 405 and attach to the substrate layer 410 at a lower region (e.g., "base") of the fin. In some embodiments, the semiconductor material from which the fins are formed may include silicon (Si), silicon carbide (SiC), and/or silicon germanium (SiGe).

FinFET 402 may include a gate structure 430. The gate structure 430 may at least partially surround at least portions of the finFET's one or more fins 415. For example, a gate structure may be formed to cover at least portions of three sides of a fin at the channel region. In some embodiments, gate structure 430 may be formed by depositing one or more layers over the substrate and fins, and by using lithographic techniques to pattern at least one gate structure over one or more fins. For example, a gate insulator and a polysilicon layer may be deposited over the fins, and the polysilicon layer may be planarized. A hard mask (e.g., a silicon nitride mask) may be deposited and patterned over the poly-silicon layer. The hard mask may be patterned using photolithography techniques and etching. The pattern of the hard mask may be transferred to the polysilicon via etching to form the gate structure 430. The length of the gate structure in a direction along the length of the fin may be between approximately 15 nm and approximately 30 nm. Other suitable techniques and materials may be used in other embodiments to form gate structure.

In some embodiments, gate structure 430 may include a gate portion 431, a gate insulator 435, and a spacer layer 438. In some embodiments, gate insulator 435 may include one or more layers and/or materials (e.g., one or more layers of silicon oxide, ethylene-type oxide, and/or any other suitable insulating material). Ethylene-type oxide may include, without limitation, ethylene oxide and/or ethylene glycol oxide. In some embodiments, gate insulator 435 may be disposed adjacent to the finFET channel region (e.g., disposed on top and side surfaces of the portions of the fin covered by gate structure 430) and configured to insulate gate portion 431 from the channel region.

In some embodiments, gate portion 431 may comprise a gate conductor. A gate conductor may include one or more layers and/or materials (e.g., one or more layers of polysilicon and/or metallic material) configured such that a voltage applied thereto controls a current between the finFET's source and drain regions. In some embodiments, spacer layer 438 may include one or more layers (e.g., one or more nitride layers) and/or materials configured to function as a gate spacer structure. In some embodiments, spacer layer 438 may include, but is not limited to, a nitride (e.g., SiN, SiOCN, SiPCN, SiBN, and/or any other suitable nitride), a boron silicide (SiB), and/or any other material suitable for forming a gate spacer structure. In some embodiments, gate portion 431, spacer layer 438, and gate insulator 435 may comprise a sacrificial gate. A sacrificial gate may include one or more layers and/or materials formed as a "dummy gate" for the finFET 402, and subsequently removed prior to formation of the finFET's final gate structure. In some embodiments, the sacrificial gate may be replaced after recessing fins and forming source and drain regions by a metal or metal silicide gate conductor and high-K dielectric for the spacer layer 438 on sidewalls of the gate conductor. The length of the metal gate, along the fin's length, may be less than the length of the sacrificial gate. For example, a sacrificial gate formed of polysilicon may be between approximately 20 nm and approximately 25 nm, and a final gate conductor may be approximately 18 nm in length.

In some embodiments, spacer layer 438 may be formed adjacent gate portion 431 and adjacent gate insulator 435. The spacer layer 438 may be formed over a hard mask 437 that was used to pattern the gate portion 431. In some implementations, the hard mask 437 and spacer layer 438 may be formed of the same material. In some embodiments, spacer layer 438 may be disposed on one or more exposed surfaces (e.g., sidewalls) of gate portion 431, and may also be disposed on one or more surfaces of the hard mask at a top surface of gate structure 430. In some embodiments, spacer layer 438 may have a thickness adjacent sidewalls of the gate portion 431 between approximately 5 nm and 15 nm, between approximately 5 nm and approximately 10 nm, or between approximately 6 nm and approximately 9 nm. In some embodiments, a suitable layer thickness for spacer layer 438 may facilitate proper formation of the finFET's source, drain, and channel regions, and may subsequently facilitate replacement of gate portion 431.

Acts 502-510 of semiconductor processing method 500 are illustrated in FIGS. 7A-12C, which depict various stages in the formation of finFET 402, according to some embodiments. Each of FIGS. 7A-12A depicts a cross-section of finFET 402 along A-A'. Each of FIGS. 7B-12B shows a cross-section of finFET 402 along B-B'. Each of FIGS. 7C-12C depicts a cross-section of finFET 402 along C-C'.

At step 502, according to some embodiments, a fin of finFET 402 may be etched, in a first etch process, to partially recess the fin at source and drain regions adjacent to a first portion of the fin covered by a gate structure of the finFET. In some embodiments, the first etch process may be anisotropic (e.g., a reactive ion etch). In some embodiments, the first etch process may be selective, such that the semiconductor material is etched in the portions of fin 415 not covered by gate structure 430 without etching (or with negligible etching of) insulating layer 405 and spacer layer 438. In some embodiments, the first etch process may include, but is not limited to, a timed etch process, and/or any other suitable type of etch process. In a timed etch process, the extent (e.g., depth) to which a layer is etched may be controlled approximately based on the etch time, wherein the etch rate is known before etching. The etch rate of a fin 415 during the first etch process may be approximately uniform across the portions of the fin not covered by gate structure 430.

During the first etch process, the portions of the fin not covered by the gate structure (e.g., the portions of the fin at the source and drain regions of the finFET) may be recessed by any suitable amount. In some embodiments, the etched portions of the fin may be recessed to remove an amount 462 equal to approximately 20% to 40% of the fin's initial height, where the fin's height 460 is the dimension in the direction normal to the surface of the substrate of the portion of the fin covered by the gate structure, as illustrated in FIG. 7C. For example, where the fin's height 460 is 30 nm, the etched portions of the fin may be recessed by an amount 462 between 20%×30 nm and 40%×30 nm=an amount between 6 nm and 12 nm. As another example, where the fin's height 460 is 50 nm, the etched portions of the fin may be recessed by an amount 462 between 20%×50 nm and 40%×50 nm=an amount between 10 nm and 20 nm.

FIGS. 7A-7C illustrate cross-sections of finFET 402 after etching the fins to partially recess the fins at the source and drain regions, according to some embodiments. In the example of FIG. 7C, the portions of fin 415a not covered by gate structure 430 (e.g., the portions of the fin corresponding to the finFET's source and drain regions) have been uniformly recessed by an amount 462, which may be between 20% and 40% of the fin's height 460. As can be seen in FIG. 7C, the partial recess of the fin may result in the formation of channel region sidewalls 464.

At step 504, according to some embodiments, a sacrificial layer 470 may be formed adjacent to the gate structure and the channel region sidewalls 464 formed by the first etch process, as depicted in FIG. 8C. Sacrificial layer 470 may be formed by any suitable process. In some embodiments, sacrificial layer 470 may be formed by conformally depositing a thin layer of sacrificial material on the wafer, and directionally etching the thin layer to remove the sacrificial material from regions of the wafer other than the sidewalls of gate structure 480 and the channel region endwalls 464. In some embodiments, sacrificial layer 470 may be formed of any suitable material, including, without limitation, a nitride (e.g., SiN, SiOCN, SiBCN, and/or any other suitable nitride), an oxide (e.g., silicon oxide, ethylene-type oxide, and/or any other suitable oxide), and/or any other material suitable for forming a sacrificial layer. In some embodiments, sacrificial layer 470 may have a thickness between approximately 3 nm and approximately 6 nm, or between 4 nm and 10 nm in some embodiments.

FIGS. 8A-8C illustrate cross-sections of finFET 402 after forming sacrificial layer 470, according to some embodiments. In the example of FIG. 8C, sacrificial layer 470 is formed on the sidewalls of gate structure 430 (e.g., on spacer layer 438) and on the channel region endwalls 464 formed by the first etch process.

At step 506, according to some embodiments, a fin of finFET 402 may be etched, in a second etch process, to recess an additional portion of the fin (e.g., a base portion of the channel region) at the source and drain junction regions. During the second etch process, the fin may be laterally recessed from the portion of the fin corresponding to the finFET's source region toward the portion of the fin corresponding to the finFET's channel region, and from the drain region toward the channel region, as depicted in FIG. 9C. In some embodiments, the fin may be laterally recessed under at least a portion of sacrificial layer 470, under channel region endwalls 464 formed by the first etch process, and/or under at least a portion of gate structure 430 (e.g., under at least a portion of spacer layer 438).

During the second etch process, the fin may be laterally recessed by any suitable amount. In some embodiments, the amount 467 of lateral recess relative to the channel region endwalls formed by the first etch process may be between approximately 5 nm and approximately 15 nm. In some embodiments, the amount of recess may be approximately 10 nm. In some embodiments, the minimum distance 466 between laterally recessed portions of the fin may be between approximately 18 nm and approximately 40 nm.

During the second etch process, the fin's height may be further recessed in portions of the fin not covered by not covered by gate structure 430 or sacrificial layer 470. In some embodiments, the second etch process may recess the height portions of the fin not covered by the gate structure by any suitable amount. In some embodiments, the amount 468 by which the etched portions of the fin are recessed during the second etch may be between approximately 5 nm and approximately 20 nm. In some embodiments, the first and second etch processes may be chosen to remove not more than between approximately 50% and approximately 80% of the fin's original height. For example, some of the fin material will remain at the base of the fin after the first and second etches for subsequent epitaxial growth of source and drain regions. According to some implementations, the second etch process may remove between approximately 20% and approximately 40% of the fin's initial height.

In some embodiments, the second etch process may be isotropic. The isotropic nature of the second etch process may result in the fin being laterally recessed under the gate structure 430, as depicted in FIG. 9C. The lateral etch may result in a curved etch front (as shown) in some embodiments, but may take other profiles depending upon the etching process used. In some embodiments, the second etch process may include, but is not limited to, a timed wet etch process, though any other suitable type of etch process may be used. For example, in embodiments where the fins are formed of silicon germanium (SiGe), the second etch process may be a timed SC1 etch. In some embodiments, the second etch process may be a dry etch process. According to some embodiments, a high-pressure plasma etch may be used to laterally etch the fin. In some embodiments, the second etch process may be a homogeneous dry etch, as described in U.S. Pat. No. 8,541,312, which is incorporated herein by reference.

In some embodiments, the sacrificial layer 470 may protect a first portion of the fin under gate structure 430 from the second etch process, such that a second portion of the fin under gate structure 430 (and under the first portion of the fin) is laterally etched without etching the first portion of the fin. In some embodiments, the second etch process may be selective, such that the semiconductor material of fin 415 is etched without etching (or with negligible etching of) insulating layer 405, spacer layer 438, and sacrificial layer 470.

FIGS. 9A-9C illustrate cross-sections of finFET 402 after etching the fins to laterally recess portions of the fins, according to some embodiments. In the example of FIG. 9C, the source and drain sides of the fin have each been laterally recessed by an amount 467, such that the laterally recessed regions extend under sacrificial layer 470 and/or under portions of gate structure 430. In addition, the portions of fin 415a not covered by gate structure 430 or sacrificial layer 470 have been vertically recessed by an amount 468.

At step 508, according to some embodiments, sacrificial layer 470 may be removed from the finFET using a wet or dry etch. In some embodiments, sacrificial layer 470 may be removed as part of a pre-epitaxial clean step. In some embodiments, sacrificial layer 470 may be removed using a wet etch containing hydrofluoric acid (HF) and/or a dry etch (e.g., a SiConi™ etch). Some techniques for performing a SiConi™ etch are described, for example, in U.S. Pat. No. 8,501,629, issued Aug. 6, 2013, and hereby incorporated herein by reference to the extent permitted by applicable law, though other conventional SiConi™ etching processes may be used in some embodiments. FIGS. 10A-10C illustrate cross-sections of finFET 402 after removing sacrificial layer 470, according to some embodiments.

Figure 11C:
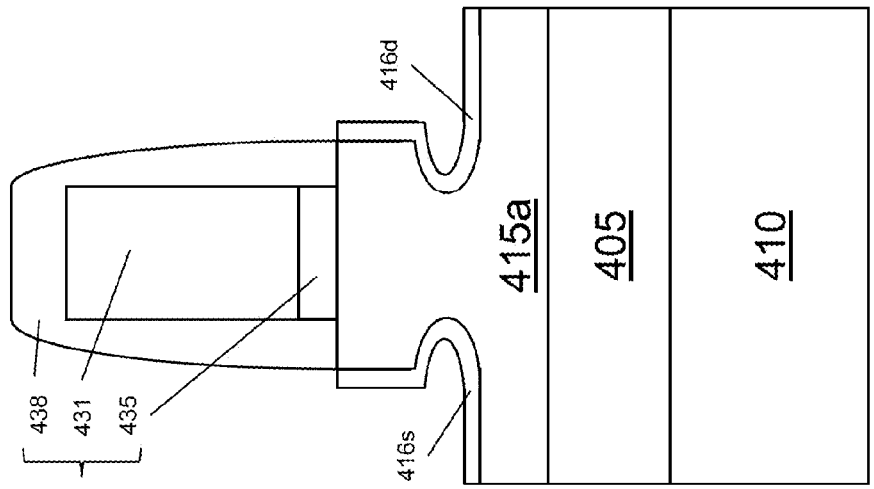
FIGS. 11A, 11B, and 11C show cross-sectional views of finFET 402 along A-A', B-B', and C-C', respectively, after another portion of a fabrication process, according to some embodiments.
Figure 11B:
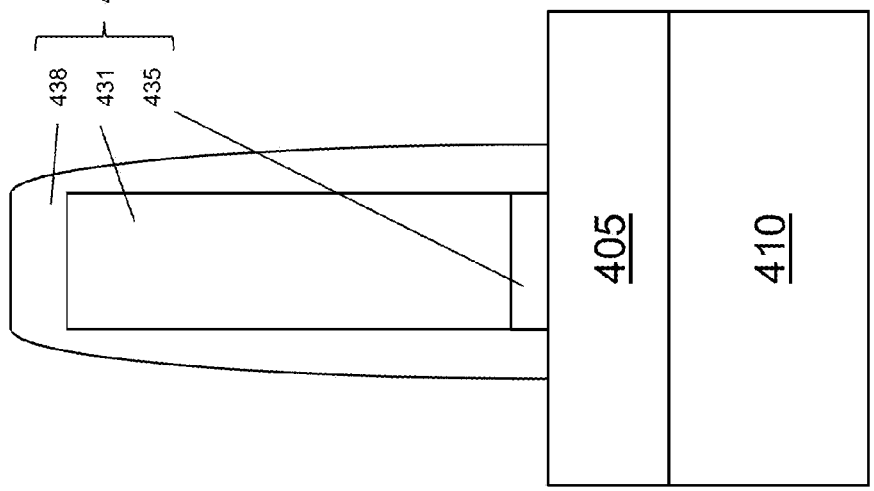
Figure 11A:
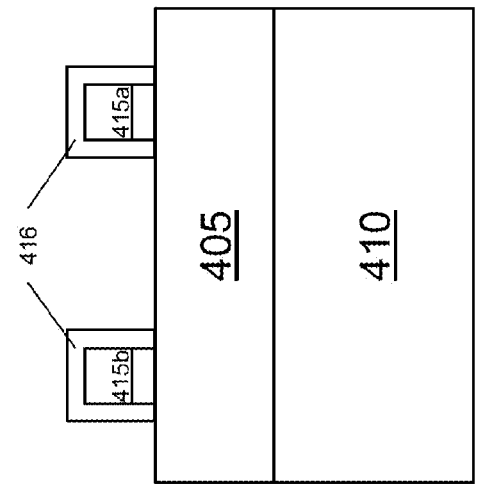

At step 510, according to some embodiments, a buffer layer 416 may be formed on the recessed fin, as depicted in FIGS. 11A and 11C. Buffer layer 416 may provide a buffer region of a selected dopant concentration between the finFET's channel region and highly doped source and drain regions to be formed on buffer layer 416. The buffer layer may provide more control over the dopant profile at the source and drain junctions, in some embodiments. The buffer layer can reduce the need for longer diffusion lengths of dopants from source and drain regions into the source and drain extension regions. In some implementations, the buffer layer is optional, and may be omitted. Instead, controlled thermal diffusion of dopants from the source and drain regions may be used to form source and drain junctions.

Buffer layer 416 may be formed of semiconductor material, including, without limitation, silicon, silicon carbide (SiC), and/or silicon germanium (SiGe). In some embodiments, different semiconductor materials may be used to form the buffer layers for pFETs and nFETs. For example, silicon carbide may be used to form the buffer layer for nFETs, and silicon germanium may be used to form the buffer layer for pFETs. The formation of a SiC buffer layer on the fin of an nFET (e.g., a Si fin) may impart tensile strain to the nFET's channel region. Likewise, the formation of a SiGe buffer layer on the fin of a pFET (e.g., a Si fin) may impart compressive strain to the pFET's channel region.

In some embodiments, buffer layer 416 may be conformally formed on exposed surfaces of the recessed fin (e.g., on the surfaces of the fin exposed by the first and/or second etch processes). Buffer layer 416 may be formed by any suitable technique. In some embodiments, buffer layer 416 may be epitaxially grown. In some embodiments, the thickness of the buffer layer may be between approximately 2 nm and approximately 6 nm, and, in some embodiments, the buffer layer thickness may be approximately 5 nm.

The formation of buffer layer 416 may further comprise doping buffer layer 416. Any suitable doping process may be used to dope buffer layer 416. For example, dopants may be added during epitaxial growth. In some embodiments, buffer layer 416 may be doped to have a concentration of dopants between approximately $3\times10^{20}$ cm$^{-3}$ and approximately $1\times10^{21}$ cm$^{-3}$. The concentration of dopants in the doped buffer layer 416 may exceed the concentration of dopants in the channel region of finFET 402. In some embodiments, the buffer layer may be doped with boron, arsenic, phosphor, or antimony, depending upon the desired conductivity type.

FIGS. 11A-11C illustrate cross-sections of finFET 402 after forming buffer layer 416, according to some embodiments. In the example of FIG. 11A, buffer layer 416 is formed on exposed surfaces of fins 415a and 415b. As can be seen in FIG. 11C, buffer layer 416 may be conformally formed on the fin, including laterally recessed surfaces of the fin. In the example of FIG. 11C, portion 416s of buffer layer 416 is formed on surfaces of fin 415a at a source region of finFET 402, and portion 416d of buffer layer 416 is formed on surfaces of fin 415a at a drain region of finFET 402.

At step 512, according to some embodiments, a source and drain layer 417 may be formed at source and drain regions of the fin (e.g., on buffer layer 416), as depicted in FIGS. 12A and 12C. Portions of source and drain layer 417 may form substantial portions of the source and drain regions of finFET 402.

Source and drain layer 417 may be formed of semiconductor material, including, without limitation, silicon, silicon carbide (SiC), and/or silicon germanium (SiGe). In some embodiments, the same semiconductor material used to form a finFET's buffer layer 416 may be used to form the finFET's source and drain layer 417. For example, the source and drain layer may be formed during a same epitaxial run during which the dopant concentration is changed after formation of the buffer layer. In embodiments where buffer layer 416 imparts strain to the finFET's channel region, a source and drain layer 417 formed of the same material as the buffer layer 416 may increase the strain imparted to the finFET's channel region. For example, the buffer layer 416 and source and drain layer 417 may be formed of SiC or SiGe when the fin is formed of Si.

Source and drain layer 417 may be formed by any suitable technique. In some embodiments, source and drain layer 417 may be epitaxially grown. In some embodiments, the height 482 of source and drain layer 417 may be between approximately 30 nm and approximately 50 nm (e.g., for a 10 nm fin-width technology node). In some embodiments, the height 482 of source and drain layer 417 may be between approximately 20 nm and approximately 30 nm (e.g., for a sub-10 nm node). In some implementations, the source and drain layer may be grown to approximately an initial height of the fin 415 before etch-back of the source and drain regions.

The formation of source and drain layer 417 may further comprise doping source and drain layer 417. Any suitable doping process may be used to dope source and drain layer 417. For example, dopants may be added during epitaxial growth. In some embodiments, source and drain layer 417 may be more heavily doped than the buffer layer, such that the concentration of dopants in source and drain layer 417 is between approximately $4 \times 10^{20}$ cm$^{-3}$ and $1 \times 10^{22}$ cm$^{-3}$. In some implementations, graded doping may be used to increase the dopant concentration during epitaxial growth to a level greater than $1 \times 10^{22}$ cm$^{-3}$. The concentration of dopants in the doped source and drain layer 417 may exceed the concentration of dopants in the doped buffer layer 416 and the concentration of dopants in channel region 450 of finFET 402. In some embodiments, source and drain layer 417 may be doped with boron, arsenic, phosphor, or antimony, depending upon the desired conductivity type. In some embodiments, source and drain layer 417 may be doped with the same dopants as buffer layer 416.

FIGS. 12A-12C illustrate cross-sections of finFET 402 after forming source and drain layer 417, according to some embodiments. In the example of FIG. 12A, source and drain layer 417 is formed on buffer layer 416. In the example of FIG. 12C, portion 417s of source and drain layer 417 is formed on buffer layer 416 at a source region of finFET 402. Likewise, in the example of FIG. 12C, portion 417d of source and drain layer 417 is formed on buffer layer 416 at a drain region of finFET 402.

As can be seen in FIG. 12C, the above-described technique for shaping the source and drain junction profiles of finFET 402 may improve the vertical profiles of these junctions. In some embodiments, because of the lateral recesses of the channel region under the gate region near the base of the fin and a high dopant density in the epitaxially grown source and drain regions, a lower temperature may be used during drive in of source and drain dopants. The lower temperature may lead to a more vertical profile of source and drain junctions near the top of the fin, as depicted in the drawing.

In the example of FIG. 12C, fin 415a includes a first portion, adjacent to gate structure 430, in which a first distance between the source and drain regions of the finFET may be substantially uniform, and/or the length 452 of channel 450 may be substantially uniform. In the example of FIG. 12C, fin 415a also includes a second portion, under the first portion of the fin, in which the second distance between the source and drain regions of the finFET may be non-uniform, and/or the length 452 of channel 450 may be non-uniform. Furthermore, the average distance between the source and drain regions in the first portion of the fin may be greater than the average distance between the source and drain regions in the second portion of the fin, such that channel region 450 may have a greater average channel length 452 in the first portion of the fin than in the second portion of the fin. As discussed above, the depth of the first portion of the fin may, in some embodiments, be between 20% and 40% of the fin's height 460 (e.g., between 6 nm and 20 nm). In some embodiments, the relatively uniform source and drain junction profiles observed in the first portion of the fin in FIG. 12C may result, at least in part, from the high concentration of dopants in a buffer layer formed at endwalls of the recessed fin and/or a reduced-temperature thermal step used to drive in dopants from the source and drain regions.

In some embodiments, the distance between source and drain junctions near the top of a fin may be approximately equal to a distance between source and drain junctions near the bottom of the fin. For example, the two distances may be approximately equal to within 5 nm in some embodiments, and to within 2 nm in some embodiments. In other embodiments, there may be a first portion near the base of the fin having vertical source and drain junction profiles that are approximately equally spaced to with 5 nm in some cases, and to with 2 nm in some cases, wherein a second portion near the top of the fin has an average separation between the source and drain junctions that may be greater than or less than that in the first portion.

Figure 13A:
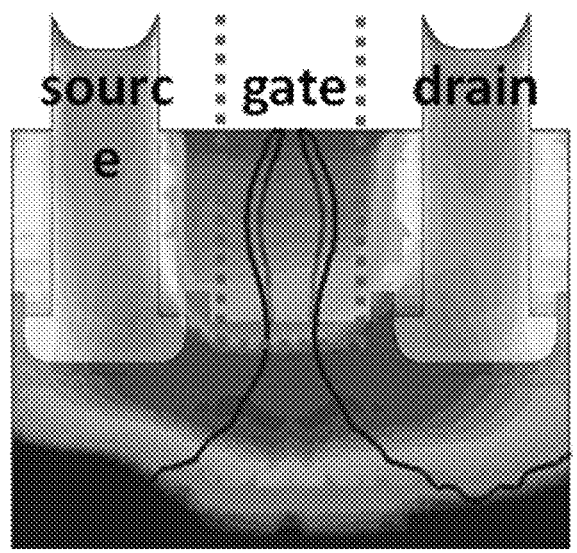
FIGS. 13A and 13B depict source/drain junction profiles for two simulated finFET structures.
Figure 13B:
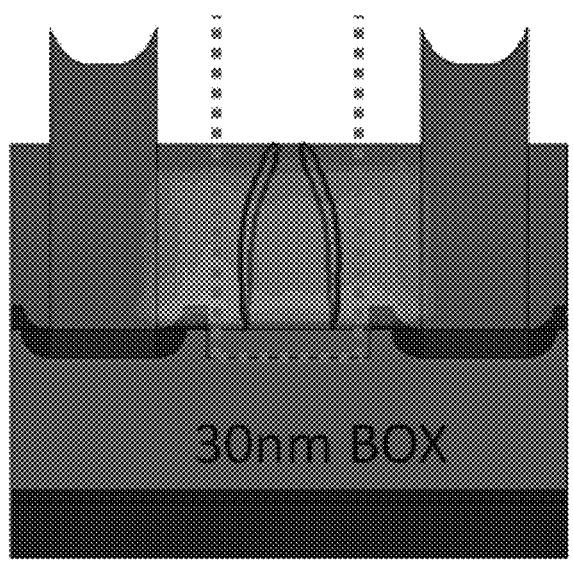

Examples of other junction profiles are shown in FIGS. 13A and 13B. According to some embodiments, the junction profile may further depend on the presence and distribution of insulating material near the base of the finFET. For example, FIG. 13A illustrates simulated source and drain junction profiles in a finFET formed on bulk silicon. FIG. 13B illustrates simulated source and drain junction profiles in a finFET formed on a silicon-on-insulator (SOI) substrate, wherein the fin is fully isolated from the bulk substrate. Lateral etching at the base of the channel region and epitaxial growth of source and drain regions was employed for both cases shown in FIGS. 13A and 13B.

The technology described herein may be embodied as a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments. Additionally, a method may include more acts than those illustrated, in some embodiments, and fewer acts than those illustrated in other embodiments. Additional acts of a method not illustrated in FIG. 4 may include, but are not limited to, forming one or more fins, replacing a sacrificial gate with a gate conductor, replacing a gate insulator with a high-K dielectric, replacing a spacer with a low-K dielectric, and/or any other suitable act.

Although embodiments of the techniques described herein have been described as conferring particular benefits, some embodiments of the techniques described herein may confer only one, fewer than all, or none of the described benefits.

Although embodiments of the techniques described herein have been described in relation to finFETs with strained source/drain regions, the techniques described herein are not limited in this regard. The techniques described herein may be applied, for example, to any finFET fabrication process wherein precise control of the source and drain junction profiles is desired.

Embodiments have been described in which portions of a finFET fin are recessed. In some embodiments, the process of recessing a structure (e.g., fin) may leave one or more indicia of the structure's recessed nature on the remaining portion of the recessed structure or elsewhere on the semiconductor device.

In some embodiments, the techniques described herein may be applied to fabricate one or more finFETs on a bulk substrate. However, using an SOI substrate rather than a bulk substrate may reduce the leakage current of the finFET and/or reduce the risk of punch-through.

As used herein, an act of "forming" a layer may include any suitable process that deposits, grows, coats, transfers, or otherwise forms a layer of material on a wafer or die, including, but not limited to, epitaxy, physical vapor deposition (PVD), chemical vapor deposition (CVD), electrochemical deposition (ECD), molecular beam epitaxy (MBE), sputtering, e-beam evaporation, and/or atomic layer deposition (ALD). In some embodiments, forming a layer may comprise additive processes (processes which add material to the wafer or die), modification processes (processes which modify properties of material on the wafer or die), and/or removal processes (processes which remove material from the wafer or die, e.g., etching).

As used herein, an act of "etching" a material or a layer may include any suitable process that removes material from a wafer or die, including, but not limited to, wet etching, dry etching, plasma etching, isotropic etching, anisotropic etching, timed etching, and/or self-limited etching. In some etch processes, a portion of the wafer is protected from the etchant by a masking material ("mask") which resists the etching, including, but not limited to a patterned photoresist or hard mask.

As used herein, the "top" of a fin may refer to a surface of the fin that is farthest from the substrate surface over which the fin is formed. In some embodiments, the top of the fin may be approximately parallel to the substrate surface over which the fin is formed.

In some embodiments, the techniques described herein may be used to form semiconductor devices as components in integrated circuits. In some embodiments, CMOS devices may be formed by applying the above-described technique (e.g., method 500) during formation of n-channel finFETs and during formation of p-channel finFETs.

Although the drawings depict one or a few transistor structures, it will be appreciated that a large number of transistors can be fabricated in parallel following the described semiconductor manufacturing processes. The transistors may be incorporated as part of microprocessing or memory circuitry for digital or analog signal processing devices. The transistors may be incorporated in logic circuitry, in some implementations. The transistors may be used in consumer electronic devices such as smart phones, computers, televisions, sensors, microprocessors, microcontrollers, field-programmable gate arrays, digital signal processors, application specific integrated circuits, logic chips, analog chips, and digital signal processing chips.

Although some of the foregoing methods and structures are described in connection with "finFETs," the methods and structures may be employed for variations of finFET devices in some embodiments. For example, according to some implementations, the methods and structures may be employed for the fabrication of tri-gate, pi-gate, or omega-gate transistors. In some embodiments, the methods and structures may be employed for the fabrication of gate-all-around (GAA) transistors.

The terms "approximately," "substantially," and "about" may be used to mean within ±20% of a target dimension in some embodiments, within ±10% of a target dimension in some embodiments, within ±5% of a target dimension in some embodiments, and yet within ±2% of a target dimension in some embodiments. The terms "approximately," "substantially," and "about" may include the target dimension.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A finFET comprising:
   a fin formed above a top surface of a substrate;
   a gate structure formed on at least portions of three sides of a channel region of the fin, said channel region having channel region sidewalls including a first sidewall portion farther from the substrate and extending perpendicular to the top surface of the substrate and a second sidewall portion nearer to the substrate and extending inwardly from the first sidewall portion in a direction under the gate structure;
   a source region formed in contact with the first and second sidewall portions of the channel region;
   a drain region formed in contact with the first and second sidewall portions of the channel region,
   wherein a first distance between source and drain junctions in the fin at the second sidewall portion is less than a second distance between source and drain junctions in the fin at the first sidewall portion.

2. The finFET of claim 1, wherein the fin is formed of a first semiconductor material, and wherein the source and drain regions are formed of a second semiconductor material.

3. The finFET of claim 2, wherein the source and drain regions further comprise a buffer layer located on the first and second sidewall portions.

4. The finFET of claim 3, wherein a dopant density of the buffer layer is higher than a dopant density in the channel region and lower than a dopant density of the source and drain regions.

5. The finFet of claim 3, wherein a dopant density of the buffer layer is between approximately $3 \times 10^{20}$ cm$^{-3}$ and approximately $1 \times 10^{21}$ cm$^{-3}$.

6. The finFET of claim 3, wherein the buffer layer is formed of the second semiconductor material.

7. The finFET of claim 3, wherein the gate structure includes a spacer layer, and wherein at least a first portion of the buffer layer extends laterally beyond at least a portion of the spacer layer in a direction of the channel region.

8. The finFET of claim 2, wherein the second semiconductor material comprises epitaxially-formed semiconductor material having a lattice constant different than the first semiconductor material.

9. The finFET of claim 1, wherein the gate structure includes a sidewall spacer, and wherein the first sidewall portion is aligned with an outer surface of the sidewall spacer.

10. The finFET of claim 9, wherein a height of the first sidewall portion of the channel region is between approximately 6 nm and approximately 20 nm.

11. The finFET of claim 9, wherein a height of the second sidewall portion of the channel region is at least 6 nm.

12. The finFET of claim 11, wherein a minimum channel length provided by the first distance is at least approximately 18 nm.

13. The finFET of claim 1, wherein a height of the first sidewall portion of the channel region is at least 20% of a total height of the fin between the gate structure and the substrate.

14. The finFET of claim 1, wherein a height of the first sidewall portion of the channel region is between approximately 20% and approximately 40% of a total height of the fin between the gate structure and the substrate.

15. The finFET of claim 1, wherein a height of the second sidewall portion of the channel region is between approximately 20% and 40% of a total height of the fin between the gate structure and the substrate.

16. A method for shaping source and drain junction profiles of a finFET, the method comprising:
   anisotropically etching first portions of a fin to partially recess source and drain regions adjacent to a channel region of the fin, the channel region of the fin being under a gate structure of the finFET; and
   isotropically etching the partially recessed source and drain regions to at least laterally recess a base portion of the fin under at least a portion of the gate structure, wherein the act of isotropically etching does not etch a portion of the fin above the base portion; and
   forming a sacrificial layer that covers endwalls of the portion of the fin above the base portion at the partially recessed source and drain regions, wherein the sacrificial layer protects the portion of the fin above the base portion from the isotropic etching.

17. The method of claim 16, wherein the gate structure includes at least one spacer layer formed on a gate conductor.

18. The method of claim 16, wherein the act of isotropically etching laterally recesses the base portion of the fin between approximately 5 nm and approximately 15 nm.

19. The method of claim 18, further comprising forming a buffer layer that is between 2 nm and 6 nm thick at least at endwalls of the fin adjacent the channel region, wherein a dopant density of the buffer layer is between approximately $3 \times 10^{20}$ cm$^{-3}$ and approximately $1 \times 10^{21}$ cm$^{-3}$.

20. The method of claim 19, further comprising forming a source and drain layer at the recessed source and drain regions, wherein the source and drain layer is formed of a semiconductor material having a different lattice constant than the semiconductor material of the fin.

21. The method of claim 20, wherein the source and drain layer are formed of SiC or SiGe and the fin is formed of Si.

22. The method of claim 21, further comprising forming the buffer layer and the source and drain layer from a same material.

23. A method for shaping source and drain junction profiles of a finFET, the method comprising:
   etching a fin to partially recess portions of the fin corresponding to source and drain regions of the finFET, the recessed portions of the fin being adjacent to a first portion of the fin, the first portion of the fin being under a gate structure of the finFET;
   forming a sacrificial layer adjacent to the first portion of the fin to protect the first portion of the fin from etching; and
   etching the fin to laterally recess a second portion of the fin under at least a part of the first portion of the fin.

24. The method of claim 23, wherein the gate structure includes at least one spacer layer formed on a gate conductor.

25. The method of claim 23, wherein the act of etching a fin to partially recess portions of the fin comprises anisotropic etching and the act of etching the fin to laterally recess a second portion of the fin comprises isotropic etching.

26. The method of claim 23, wherein the act of etching the fin to laterally recess a second portion of the fin recesses the second portion of the fin between approximately 5 nm and approximately 15 nm in a direction under the gate structure.

* * * * *